United States Patent [19]

Müller

[11] 4,374,913
[45] Feb. 22, 1983

[54] GRANULATED SCREEN AND A METHOD OF MANUFACTURING SAME

[75] Inventor: Hans E. Müller, Dielsdorf, Switzerland

[73] Assignee: Licht Druck Ag, Switzerland

[21] Appl. No.: 280,160

[22] Filed: Jul. 2, 1981

[30] Foreign Application Priority Data

Feb. 5, 1981 [EP] Europen Pat. Off. ........... 81 100 822

[51] Int. Cl.³ .............................................. G03F 5/00
[52] U.S. Cl. ........................................ 430/6; 430/302
[58] Field of Search ................ 430/4, 5, 6, 270, 302; 428/440; 106/38.25

[56] References Cited

U.S. PATENT DOCUMENTS

| 809,157 | 1/1906 | Weyl | 430/6 |
| 1,587,271 | 6/1926 | Beebe et al. | 430/270 |
| 3,579,368 | 5/1971 | Bleiweiss | 428/440 |
| 4,199,358 | 4/1980 | Parsons | 430/320 |

FOREIGN PATENT DOCUMENTS

| 139472 | 5/1921 | United Kingdom | 430/6 |
| 442473 | 2/1936 | United Kingdom | 430/6 |

Primary Examiner—J. Travis Brown
Attorney, Agent, or Firm—Sheridan Neimark

[57] ABSTRACT

A thin translucent film is applied onto a plate of glass by pouring an asphalt solution on such plate. The asphalt coating is dried under influence of light whereby the asphalt will become insoluble and a fine grain is developed. This grain is thereafter printed optically onto a photosensitive material.

3 Claims, 1 Drawing Figure

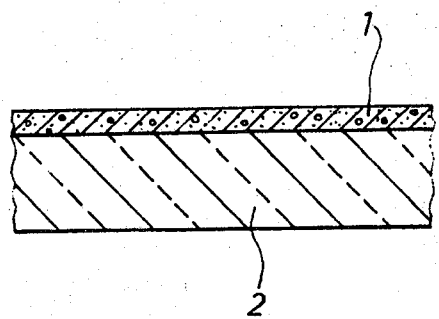

GRANULATED SCREEN AND A METHOD OF MANUFACTURING SAME

BACKGROUND OF THE INVENTION

1. Field of the Invention

The present invention relates to a method of manufacturing a granulated screen whereby the grain of a translucent layer on a plate of glass is printed optically onto a photosensitive material. It is related further to a granulated screen.

2. Description of the Prior Art

Generally known granulated screens comprise unevenly distributed structures having an area-like effect. Many procedures are utilized to manufacture these structures.

The FR-A-1 No. 475 816 discloses a granulated screen whereby a plastics foil is arranged on a plate of glass. Thereafter the grain is printed optically by exposure to light. The structures formed by such granulated screen are distinctly definable and may also be discerned in a print made therewith. This granulated screen may prevent at the most the so-called Moire formation. The granulated screen allows, however, not a printing of true halftones such as is possible in photolithography. Furthermore, its production is quite complicated and intrinsic.

SUMMARY OF THE INVENTION

Hence, it is a general object of the present invention to provide an improved method of manufacturing a granulated screen, with which granulated screens of a high resolution can be manufactured much easier and at reduced costs.

A further object of the invention is to provide a granulated screen which produces in use a much finer resolving of the halftones in comparison with known photolithography means and allows a more exact and improved tonally correct copying of an original and allows the manufacture of prints having an excellent fidelity of reproduction.

Now, in order to implement these and still further objects of the invention which will become more readily apparent as the description proceeds, the method of manufacturing a granulated screen of this development is manifested by the features of depositing a coating of asphalt solution onto the glass plate and of letting the asphalt solution dry under the influence of light such to form the grain.

BRIEF DESCRIPTION OF THE DRAWING

The invention will be better understood and objects other than those set forth above will become apparent when consideration is given to the following detailed description thereof. Such description makes reference to the annexed drawings wherein:

The single FIGURE is a view of a section through a granulated screen manufactured in accordance with the invention and drawn on a greatly enlarged scale.

DETAILED DESCRIPTION OF THE PREFERRED EMBODIMENT

The granulated screen is manufactured by providing initially a clean, dustless plate of glass having no scratches. An asphalt solution is deposited onto a surface of said plate 1 of glass such that a thin layer 2 of such asphalt solution is produced thereon.

The asphalt solution as such is a generally known substance such as utilized in asphalt copying procedures or in the photochrominum methods.

After applying the asphalt solution on the glass plate the solution is dried under influence of light rendering the asphalt insoluble whereby an extremely fine grain is formed.

Thereafter, the grain is printed optically onto a photosensitive material.

Tests revealed that the grain number per centimeter of the inventive granulated screen amounts to 300. This compares with the grain numbers of photolithography amounting to 230 and of common granulated screens amounting to 180.

The resolution can be improved by a double exposure such that a grain number of about 400 is arrived at.

Specimens of the inventive granulated screen encompassing a glass plate and the asphalt layer were tested at the Swiss Federal Material Testing Laboratories.

Three specimens were tested.
Surface area of specimen 1: 10,030 square millimeters
Surface area of specimen 2: 10,140 square millimeters
Surface area of specimen 3: 10,040 square millimeters The asphalt layer was washed off the glass plates by the agency of a benzol/toluol mixture. Thereafter a final cleaning was carried out by the agency of chloroform. The glass plates were dried in a drying cabinet at a temperature of 100° C.

The amount of material of the layer was determined in that the glass plate including the asphalt layer and thereafter the cleaned glass plate were weighed. Prior to weighing the side edges of the plates were cleaned by means of a fine glass paper, specifically the side thereof carrying the asphalt layer.

The testing results were as follows:
Specimen 1: quantity of material of layer 2.69 grams/sq. meter
Specimen 2: quantity of material of layer 2.84 grams/sq. meter
Specimen 3: quantity of material of layer 2.43 grams/sq. meter
Mean value: 2.66 grams/square meter.

The specific weight of the layer material was assumed to be 0.9 grams/cubic centimeter. Accordingly, the average thickness of the layer amounted to 0.003 mm.

While there are shown and described present preferred embodiments of the invention, it is to be distinctly understood that the invention is not limited thereto, but may be otherwise variously embodied and practiced within the scope of the following claims.

Accordingly, What is claimed is:

1. A method of manufacturing a granulated screen comprising depositing a thin asphalt solution on a plate of glass; drying said asphalt solution under the influence of light to form a fine grain having a grain number of at least about 300 grains/cm; and optically printing said grain onto a photosensitive material.

2. An improved granulated screen, including a glass plate covered by a translucent layer incorporating the grain, which grain is intended to be printed optically onto a photosensitive material, wherein said translucent layer comprises asphalt which is dried under the influence of light, wherein the specific weight of said asphalt is about 0.9 grams/cubic centimeter and the mean thickness of said layer is about 0.003 millimeters.

3. An improved granulated screen made by the process of claim 1 and comprising a developed photosensitive material which has been optically printed by exposure to an asphaltic layer dried under the influence of light and having a grain number of at least about 300 grains/cm.

* * * * *